US 9,949,368 B2

(12) United States Patent
Baba

(10) Patent No.: US 9,949,368 B2
(45) Date of Patent: Apr. 17, 2018

(54) RESIN SUBSTRATE AND ELECTRONIC DEVICE

(71) Applicant: Murata Manufacturing Co., Ltd., Nagaokakyo-shi, Kyoto-fu (JP)

(72) Inventor: Takahiro Baba, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/695,038

(22) Filed: Sep. 5, 2017

(65) Prior Publication Data

US 2017/0367181 A1 Dec. 21, 2017

Related U.S. Application Data

(63) Continuation of application No. PCT/JP2016/084698, filed on Nov. 24, 2016.

(30) Foreign Application Priority Data

Dec. 7, 2015 (JP) ................................ 2015-238322

(51) Int. Cl.
*H05K 1/09* (2006.01)
*H05K 1/00* (2006.01)
(Continued)

(52) U.S. Cl.
CPC ......... *H05K 1/0306* (2013.01); *H05K 1/0207* (2013.01); *H05K 1/0242* (2013.01);
(Continued)

(58) Field of Classification Search
CPC .... H05K 1/036; H05K 1/0207; H05K 1/0242; H05K 1/0243
(Continued)

(56) References Cited

U.S. PATENT DOCUMENTS

2012/0097433 A1* 4/2012 Kato ....................... H01P 3/081
174/254
2012/0138340 A1* 6/2012 Kato ....................... H05K 1/028
174/251
(Continued)

FOREIGN PATENT DOCUMENTS

JP 2001-036202 A 2/2001
JP 2011-040516 A 2/2011
(Continued)

OTHER PUBLICATIONS

Official Communication issued in International Patent Application No. PCT/JP2016/084698, dated Feb. 7, 2017.

*Primary Examiner* — Sherman Ng
(74) *Attorney, Agent, or Firm* — Keating & Bennett, LLP

(57) ABSTRACT

A resin substrate includes an insulating substrate, and first and second signal conductors that partially extend in parallel or substantially in parallel with each other along a signal transmission direction. The first signal conductor includes a parallel portion that extends in parallel or substantially in parallel with the second signal conductor along the signal transmission direction, and a first connection portion. In a portion where the first signal conductor and the second signal conductor extend in parallel or substantially in parallel with each other, the first signal conductor and the second signal conductor are disposed at a same position in the thickness direction of the insulating substrate, and the first connection portion is disposed at a different position from the second signal conductor in the thickness direction and a width direction of the insulating substrate.

20 Claims, 12 Drawing Sheets

(51) Int. Cl.
*H05K 1/03* (2006.01)
*H05K 3/46* (2006.01)
*H05K 1/02* (2006.01)

(52) U.S. Cl.
CPC ........... *H05K 1/0243* (2013.01); *H05K 1/036* (2013.01); *H05K 3/4632* (2013.01)

(58) Field of Classification Search
USPC ................................................ 174/254, 257
See application file for complete search history.

(56) References Cited

U.S. PATENT DOCUMENTS

2014/0176266 A1* 6/2014 Kato .................. H01P 3/08
333/238
2015/0295296 A1 10/2015 Ikemoto et al.

FOREIGN PATENT DOCUMENTS

WO 2010/150588 A1 12/2010
WO 2014/178295 A1 11/2014

* cited by examiner

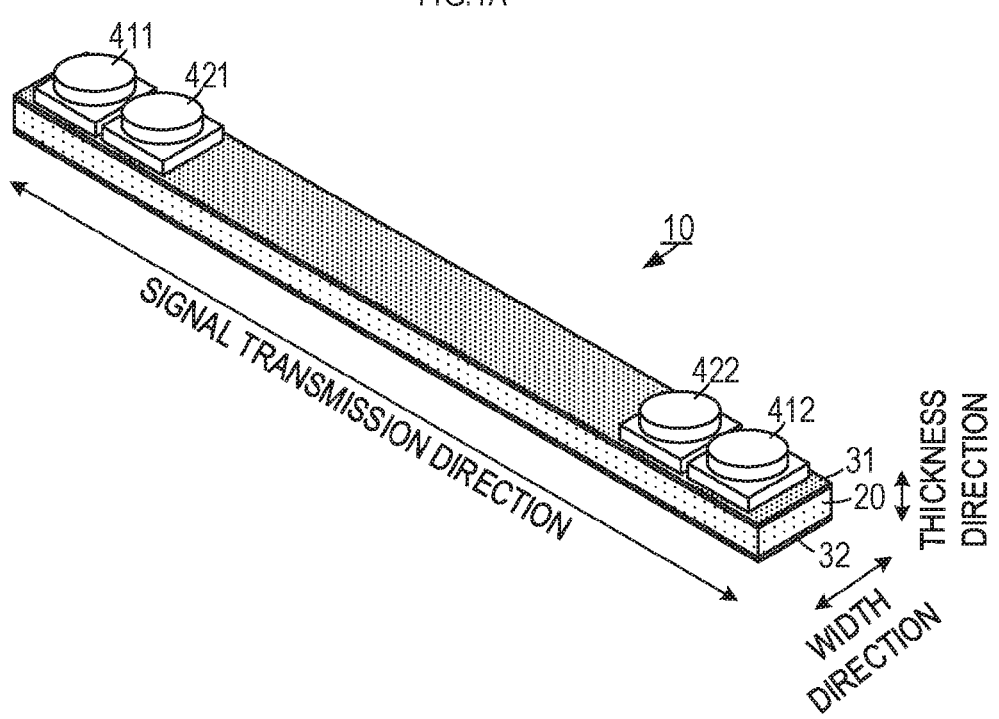

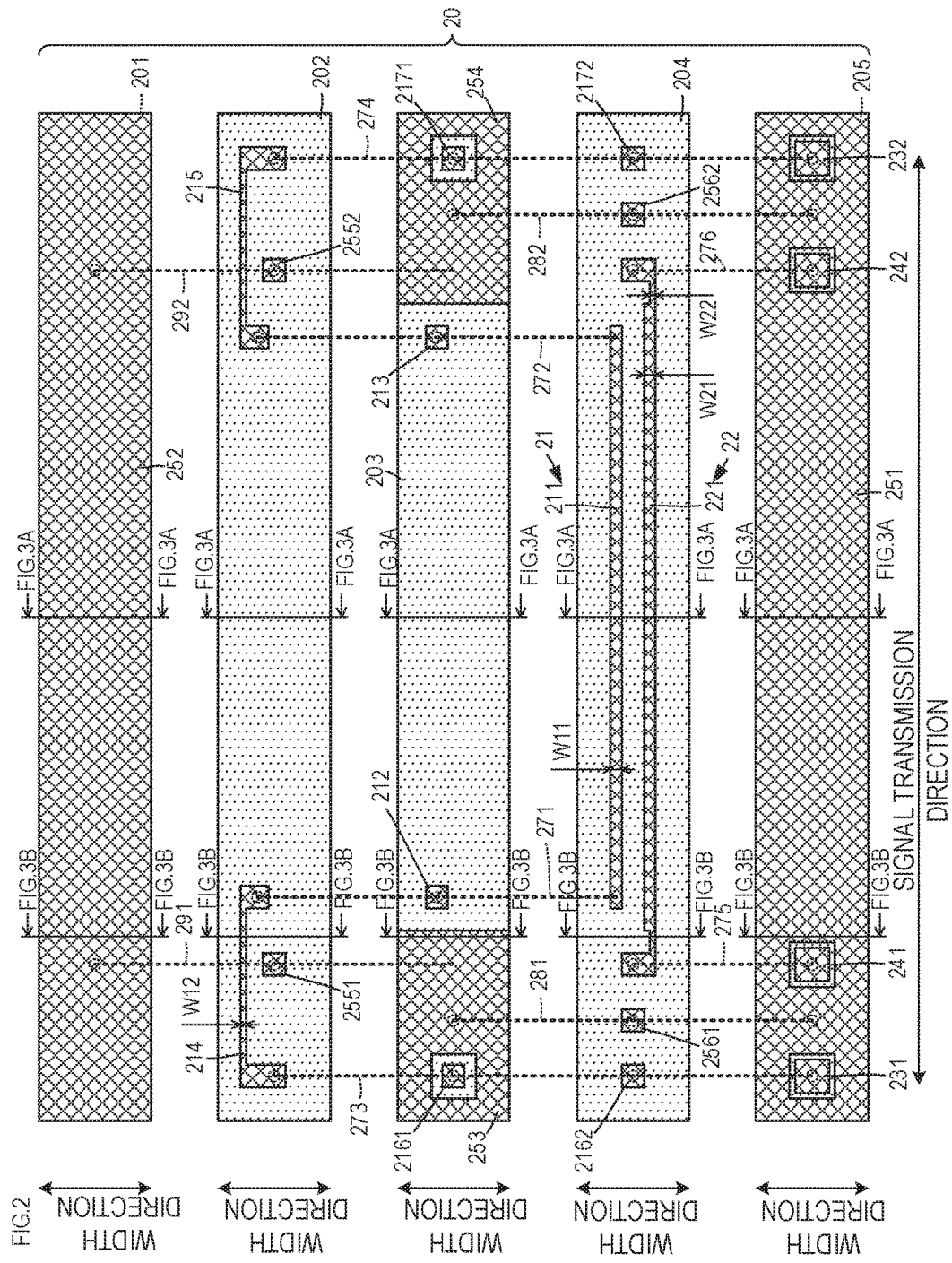

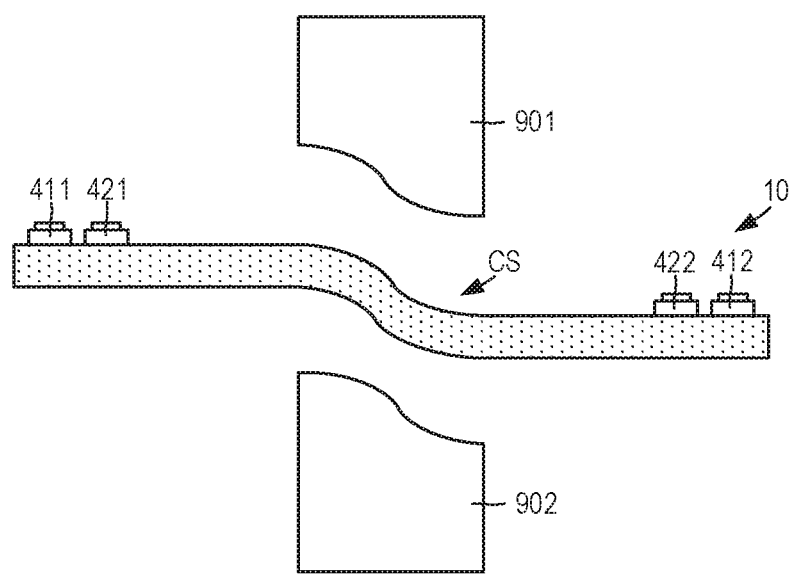

RESIN SUBSTRATE AND ELECTRONIC DEVICE

CROSS REFERENCE TO RELATED APPLICATIONS

This application claims the benefit of priority to Japanese Patent Application No. 2015-238322 filed on Dec. 7, 2015 and is a Continuation Application of PCT Application No. PCT/JP2016/084698 filed on Nov. 24, 2016. The entire contents of each application are hereby incorporated herein by reference.

BACKGROUND OF THE INVENTION

1. Field of the Invention

The present invention relates to a resin substrate including a plurality of signal conductors, and electronic devices including the resin substrate.

2. Description of the Related Art

WO 2010/150588 A describes a signal wire path in which a plurality of signal wires (signal conductor) are provided in parallel. For the signal wire path described in WO 2010/150588, a plurality of signal wires are arranged in parallel in a middle portion of the plurality of signal wires. Conductor patterns for an external connection terminal are formed in end portions of the plurality of signal wires. The conductor patterns for an external connection terminal have a width wider than that of conductor patterns in the middle portion of the signal wires. Thus, the connection reliability is improved by such a structure.

The end portions of the plurality of signal wires on the same side are bent so as to be separated from one another. This increases a distance between the conductor patterns for an external connection terminal, so that isolation between the conductor patterns for an external connection terminal is ensured.

However, in the structure described in WO 2010/150588, the increase in distance between the conductor patterns for an external connection terminal increases a width of the signal wire path (a width of an insulating substrate, itself, which forms the signal wire path) in an external connection portion.

On the other hand, if the width of the insulating substrate itself is narrowed in the external connection portion, the distance between the conductor patterns for an external connection terminal will be shortened. This also shortens a distance between signal conductors to be connected to the conductor patterns, which makes it difficult to ensure the isolation.

SUMMARY OF THE INVENTION

Preferred embodiments of the present invention provide resin substrates capable of ensuring isolation of an external connection terminal without increasing a width of an insulating substrate in an external connection portion, and electronic devices including the resin substrates.

A resin substrate according to a preferred embodiment of the present invention includes an insulating substrate, and a first signal conductor and a second signal conductor that are provided in the insulating substrate. The first signal conductor and the second signal conductor partially extend in parallel or substantially in parallel with each other along a signal transmission direction. The resin substrate includes a first external connection conductor and a second external connection conductor. The first signal conductor is connected to one end of the first external connection conductor in the signal transmission direction, and is exposed at a first surface of the insulating substrate. The second signal conductor is connected to one end of the second external connection conductor in the signal transmission direction, and is exposed at the first surface of the insulating substrate. The first external connection conductor and the second external connection conductor are arranged side by side along the signal transmission direction. The first signal conductor includes a parallel portion that extends in parallel or substantially in parallel with the second signal conductor along the signal transmission direction, and a first connection portion that connects the parallel portion and the first external connection conductor. In a portion where the first signal conductor and the second signal conductor extend in parallel or substantially in parallel with each other, the first signal conductor and the second signal conductor are disposed at the same or substantially the same position in a thickness direction of the insulating substrate. The first connection portion is disposed at a different position from the second signal conductor in the thickness direction and a width direction of the insulating substrate.

With this structure, the first external connection conductor to be connected to the first signal conductor and the second external connection conductor to be connected to the second signal conductor connects are disposed side by side along the signal transmission direction, which prevents a width of the external connection portion of the resin substrate (insulating substrate) from widening. Further, near the external connection portion, the first signal conductor and the second signal conductor are separated from each other in the thickness direction and the width direction of the insulating substrate, and thus, the isolation is ensured.

Further, in a resin substrate according to a preferred embodiment of the present invention, a width of the insulating substrate in a portion where the first external connection conductor and the second external connection conductor are provided may preferably be less than or equal to a width of the insulating substrate in a portion where the parallel portion of the first signal conductor and the second signal conductor are disposed.

With this structure, a width of the entire resin substrate is reduced, while the isolation in the external connection portion is ensured.

Further, in a resin substrate according to a preferred embodiment of the present invention, a conduction width in the parallel portion is preferably wider than a conduction width in the first connection portion.

With this structure, the transmission loss is prevented.

Further, in a resin substrate according to a preferred embodiment of the present invention, a length of the parallel portion is preferably longer than a length of the first connection portion.

With this structure, the length of the parallel portion, which has a small transmission loss, is relatively long, so that the transmission loss is prevented.

Further, in a resin substrate according to a preferred embodiment of the present invention, it is preferred that, in the thickness direction of the insulating substrate, an intermediate ground conductor is disposed between a position where the first connection portion is disposed and a position where the second signal conductor is disposed.

With this structure, the first signal conductor and the second signal conductor are prevented from being connected in the external connection portion, so as to ensure higher isolation.

Further, in a resin substrate according to a preferred embodiment of the present invention, a ground conductor is disposed between the first external connection conductor and the second external connection conductor on a first surface of the insulating substrate, and the ground conductor is preferably connected to the intermediate ground conductor through an interlayer connection conductor.

This structure makes it possible to ensure still higher isolation between the first external connection conductor and the second external connection conductor, so that still higher isolation is ensured in the external connection portion.

Further, in a resin substrate according to a preferred embodiment of the present invention, a conductor width in a portion where the second signal conductor faces the intermediate ground conductor is preferably narrower than a conductor width in a portion where the second signal conductor extends in parallel or substantially in parallel with the first signal conductor.

With this structure, the characteristic impedance of the second signal conductor in the external connection portion is more securely set to an appropriate value.

Further, in a resin substrate according to a preferred embodiment of the present invention, the second signal conductor includes a parallel portion that extends in parallel or substantially in parallel with the first signal conductor along the signal transmission direction, and a second connection portion that connects the parallel portion and the second external connection conductor. The second connection portion may be disposed at a different position from the first connection portion in the thickness direction and the width direction of the insulating substrate.

This structure makes it possible to increase ways of extending the signal conductor, so that isolation is more securely ensured without widening the width.

Further, in a resin substrate according to a preferred embodiment of the present invention, it is preferable that the insulating substrate is made of a thermoplastics resin, for example.

With this structure, the resin substrate is able to be more easily provided.

Further, in a resin substrate according to a preferred embodiment of the present invention, it is preferable that the insulating substrate has flexibility.

With this structure, the resin substrate is easily bent or twisted, so as to make it easy to connect with a circuit board or other suitable structure.

Further, a resin substrate according to a preferred embodiment of the present invention may preferably include a first connector member to be mounted on the first external connection conductor, and a second connector member to be mounted on the second external connection conductor.

This structure makes it possible to connect with a circuit board through the connector members.

Further, an electronic device according to a preferred embodiment of the present invention includes a resin substrate including the above-described connector members, and a circuit board on which a first circuit board side connector to be connected to the first connector member and a second circuit board side connector to be connected to the second connector member are provided.

With this structure, by using the above-described resin substrate, the degree of freedom of wiring within a circuit board or between circuit boards is improved. In this case, isolation between two signal wire paths is ensured.

Further, an electronic device according to a preferred embodiment of the present invention includes a resin substrate that does not include the above-described connector member, and a circuit board on which a first land conductor and a second land conductor are provided. Herein, the first external connection conductor and the second external connection conductor are to be mounted on the first land conductor and the second land conductor, respectively. The first external connection conductor is bonded to the first land conductor through a conductive material and the second external connection conductor is bonded to the second land conductor through a conductive material to surface-mount the resin substrate on the circuit board.

This structure makes it possible to mount the resin substrate in the same process as other mounting components by using a mounting machine. Further, by using the connector connection, the resin substrate and the circuit board are able to be stably connected to one another. Still further, if the resin substrate includes a corner portion (curved portion), the degree of freedom of wiring within the circuit board or between circuit boards is improved. Furthermore, if the degree of freedom of a shape of the resin substrate is improved, the degree of freedom of the arrangement of mounting components on a surface of the circuit board will also be improved. In this case, isolation between two signal wire paths is ensured. Still furthermore, the height of wires is able to be reduced, so as to prevent an increase in thickness of electronic devices.

According to various preferred embodiments of the present invention, a width of the external connection portion is able to be reduced, and isolation between the external connection terminals is able to be ensured.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is an external perspective view of the resin substrate in accordance with a first exemplary preferred embodiment of the present invention.

FIG. 2 is an exploded plan view of the resin substrate in accordance with the first exemplary preferred embodiment of the present invention.

FIG. 8 is a side view showing a modified state of the resin substrate.

DETAILED DESCRIPTION OF THE PREFERRED EMBODIMENTS

Figure 1B:
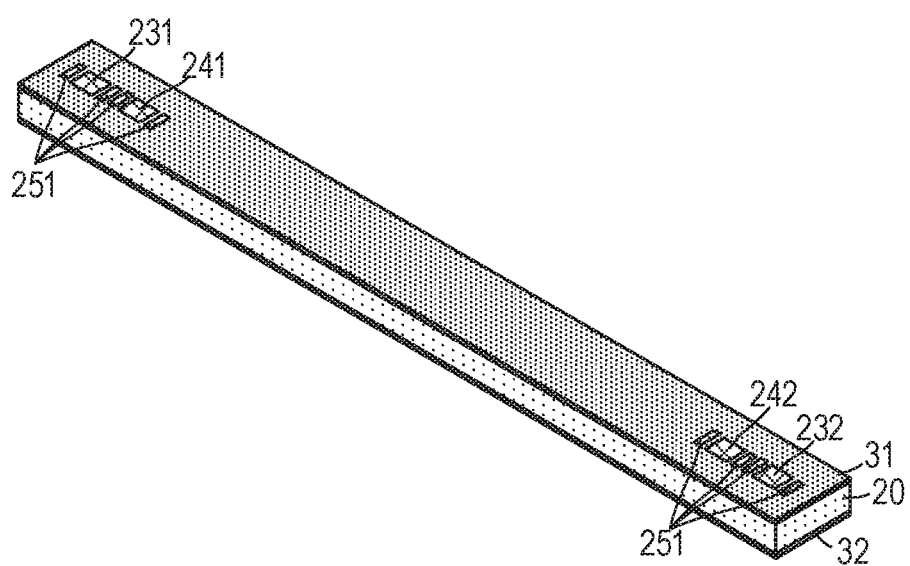
FIG. 1B is an external perspective view of the resin substrate in accordance with the first exemplary preferred embodiment of the present invention in a state where a connector member is removed.
Figure 1C:
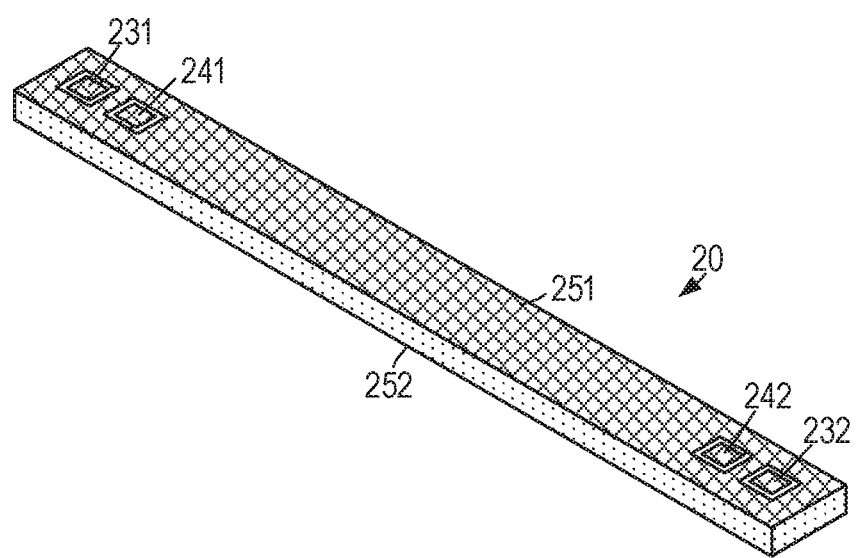
FIG. 1C is an external perspective view of an insulating substrate in accordance with the first exemplary preferred embodiment of the present invention.
Figure 3A:
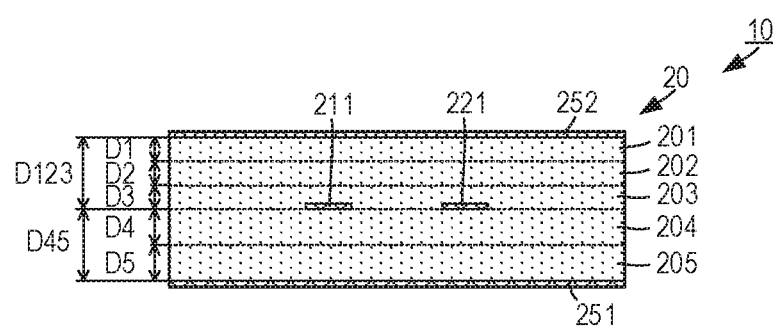
FIG. 3A is a cross-sectional view of the resin substrate in accordance with the first exemplary preferred embodiment of the present invention.
Figure 3B:
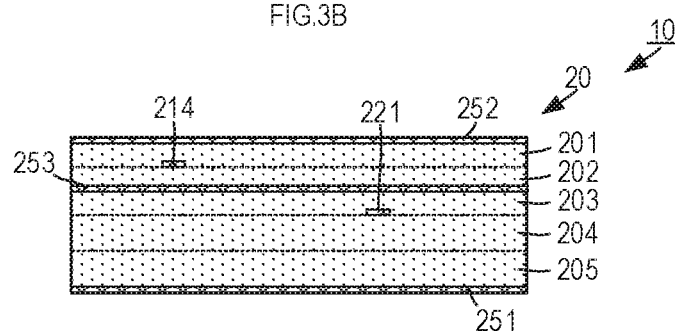
FIG. 3B is a cross-sectional view of the resin substrate in accordance with the first exemplary preferred embodiment of the present invention.
Figure 4A:
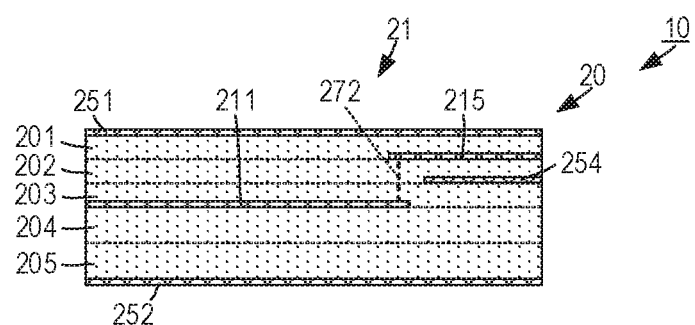
FIG. 4A is a cross-sectional view explaining a structure of a connection portion of the resin substrate in accordance with the first exemplary preferred embodiment of the present invention.
Figure 4B:
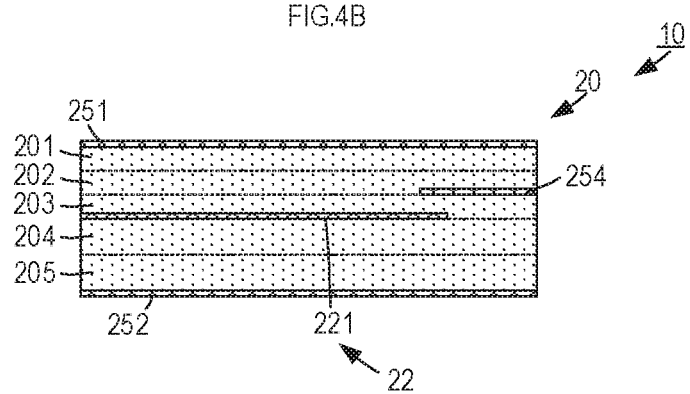
FIG. 4B is a cross-sectional view explaining a structure of a connection portion of the resin substrate in accordance with the first exemplary preferred embodiment of the present invention.

A resin substrate in accordance with a first exemplary preferred embodiment of the present invention will be described with reference to the drawings. FIG. 1A is an external perspective view of the resin substrate in accordance with the first exemplary preferred embodiment of the present invention. FIG. 1B is an external perspective view of the resin substrate in accordance with the first exemplary preferred embodiment of the present invention in a state where a connector member is removed. FIG. 1C is an external perspective view of an insulating substrate in accordance with the first exemplary preferred embodiment of the present invention. FIG. 2 is an exploded plan view of the resin substrate in accordance with the first exemplary preferred embodiment of the present invention. FIG. 3 is a cross-sectional view of the resin substrate in accordance with the first exemplary preferred embodiment of the present invention. FIG. 4A shows a structure of a first signal conductor, and FIG. 4B shows a structure of a second signal conductor.

As shown in FIGS. 1A-1C, a resin substrate 10 includes an insulating substrate 20, insulating protection members 31 and 32, and connector members 411, 412, 421, and 422.

As shown in FIG. 2, a first signal conductor 21 and a second signal conductor 22 are built in the insulating substrate 20, and the first signal conductor 21 and the second signal conductor 22 partially extend in parallel or substantially in parallel with each other. Note that, a specific internal structure of the insulating substrate 20 will be described later.

The insulating substrate 20 has an elongated shape along a transmission direction (signal transmission direction) in which a high frequency signal is transmitted by using the resin substrate 10, and the insulating substrate 20 has a constant width. As shown in FIGS. 1A-1C, and FIG. 2, a width direction of the insulating substrate 20 is a direction perpendicular or substantially perpendicular to the signal transmission direction.

As shown in FIG. 1C, external connection conductors 231, 232, 241, and 242, and a ground conductor 251 are provided on a first major surface of the insulating substrate 20. The ground conductor 251 is provided over the entire or substantially the entire area of the first major surface.

An external connection conductor 231 is an external connection portion located on one end side of the first signal conductor 21, and an external connection conductor 232 is an external connection portion located on the other end side of the first signal conductor 21. An external connection conductor 241 is an external connection portion located on one end side of the second signal conductor 22, and an external connection conductor 242 is an external connection portion located on the other end side of the second signal conductor 22.

The external connection conductors 231, 232, 241, and 242 are arranged side by side along the signal transmission direction. For the external connection conductors 231, 232, 241, and 242, more specifically, the external connection conductor 231, the external connection conductor 241, the external connection conductor 242, and the external connection conductor 232 are arranged in this order from one end side of the first major surface in the signal transmission direction. The external connection conductors 231 and 241 are disposed near the one end side of the first major surface in the signal transmission direction. The external connection conductors 232 and 242 are disposed near the other end side of the first major surface in the signal transmission direction. The ground conductor 251 and the external connection conductors 231, 232, 241, and 242 are separated from one another by conductor non-forming portions. A group of the external connection conductors 231 and 241 corresponds to a group of "a first external connection conductor and a second external connection conductor", and a group of external connection conductor 232 and 242 corresponds to a group of "the first external connection conductor and the second external connection conductor".

The conductor non-forming portion surrounding the external connection conductor 231 and the conductor non-forming portion surrounding the external connection conductor 241 are not integrated. With this structure, the ground conductor 251 is interposed between the external connection conductors 231 and 241 that are close to each other. This makes it possible to improve isolation between the external connection conductors 231 and 241. The conductor non-forming portion surrounding the external connection conductor 232 and the conductor non-forming portion surrounding the external connection conductor 242 are not integrated. With this structure, the ground conductor 251 is interposed between the external connection conductors 232 and 242 that are close to each other. This makes it possible to improve isolation between the external connection conductors 232 and 242.

A ground conductor 252 is provided over the entire or substantially the entire area of a second major surface of the insulating substrate 20. The first major surface and the second major surface are two surfaces perpendicular or substantially perpendicular to the thickness direction of the insulating substrate 20.

For instance, a cover layer film is adhered to the insulating substrate 20, or a resist film is printed on the insulating substrate 20 to define insulating protection members 31 and 32. The insulating protection member 31 is provided on a first surface of the insulating substrate 20. A plurality of openings are provided in the insulating protection member 31. Through these openings, the external connection conductors 231, 232, 241, and 242 are exposed at the outside of the first surface. Further, a plurality of openings are also provided in portions close to the external connection conductors 231, 232, 241, and 242. With these openings, the portions of the ground conductor 251 close to the external connection conductors 231, 232, 241, and 242 are exposed at the first surface side. Conversely, the ground conductor 251 is preferably covered with an insulating protection member 31 except for these portions.

The insulating protection member 32 is provided on a second surface of the insulating substrate 20. Thus, the entire or substantially the entire ground conductor 252 is covered with the insulating protection member 32.

A connector member 411 is mounted on the external connection conductor 231 and the ground conductor 251 that surrounds the external connection conductor 231 and is exposed. A connector member 412 is mounted on the external connection conductor 232 and the ground conductor 251 that surrounds the external connection conductor 232 and is exposed. A connector member 421 is mounted on the external connection conductor 241 and the ground conductor 251 that surrounds the external connection conductor 241 and is exposed. A connector member 422 is mounted on the external connection conductor 242 and the ground conductor 251 that surrounds the external connection conductor 242 and is exposed.

As mentioned above, in the resin substrate 10 of the present exemplary preferred embodiment, external connection portions in which the external connection conductors 231, 232, 241, and 242, and connector members 411, 412, 421, and 422 are disposed preferably have the same or substantially the same width as a width of a portion in which main signal conductors are wired in the middle of the resin substrate 10 in the signal transmission direction. Thus, the resin substrate 10 with a narrow external connection portion is able to be provided. In this case, the ground conductor 251 is disposed between the external connection conductors 231 and 241, and between the external connection conductors 232 and 242, so as to ensure isolation between the external connection conductors 231 and 241, and isolation between external connection conductors 232 and 242. Note that, the resin substrate 10 in accordance with the present exemplary preferred embodiment shows, as an example, that the external connection portion has the same or substantially the same width as the portion in which the main signal conductors are wired, but the external connection portion may have a width narrower than that of the portion in which the main signal conductors are wired.

Next, a structure inside the insulating substrate 20 will be described more specifically.

As shown in FIG. 2, the insulating substrate 20 includes insulator layers 201, 202, 203, 204, and 205. The insulator layers 201, 202, 203, 204, and 205 are preferably made of a thermoplastic resin, for example. As a specific example, the insulator layers 201, 202, 203, 204, and 205 are preferably made of a liquid crystal polymer-based resin, for example. If a liquid crystal polymer is used, the material will be effective because the polymer has an excellent high frequency characteristic. For the insulator layers 201, 202, 203, 204, and 205, from the first major surface side of insulating substrate 20, the insulator layer 205, the insulator layer 204, the insulator layer 203, the insulator layer 202, and the insulator layer 201 are laminated in this order. Note that, the number of laminated insulator layers is not limited to this number, but may be determined depending on a conductor pattern, characteristics, or other factors of a circuit that is built therein, as necessary. In this case, the number of laminated layers is preferably reduced as much as possible, and preferably reduced to the degree that the resin substrate 10 has flexibility. If the resin substrate 10 has flexibility, the resin substrate 10 is easy to bend or twist, so as to improve the degree of freedom of arrangement of an external circuit board and a case.

The ground conductor 251 is provided over the entirety or substantially the entirety of an opposite side surface (first surface of the resin substrate 10) of the insulator layer 205 from the insulator layer 204. Further, on the surface, the external connection conductors 231, 232, 241, and 242 are provided. Each of the external connection conductors 231, 232, 241, and 242 preferably has a rectangular or substantially rectangular shape. The external connection conductors 231, 232, 241, and 242 are each separated from the ground conductor 251 by a corresponding one of the conductor non-forming portions surrounding them.

The external connection conductors 231 and 241 are provided near one end of the insulator layer 205 in the signal transmission direction. From the one end side, the external connection conductor 231 and the external connection conductor 241 are arranged in this order. The external connection conductors 232 and 242 are provided near the other end of the insulator layer 205 in the signal transmission direction. From the other end side, the external connection conductor 232 and the external connection conductor 242 are arranged in this order. External connection conductor 231, 232, 241, and 242 are arranged side by side along the signal transmission direction.

Conductor patterns 211 and 221 are provided on an opposite side surface of the insulator layer 204 from the insulator layer 205. Each of the conductor patterns 211 are 221 is preferably a linear conductor and has an elongated shape along the signal transmission direction of the insulator layer 204.

One end of the conductor pattern 221 is overlapped with the external connection conductor 241 when the resin substrate 10 is viewed from a plan view. The one end of the conductor pattern 221 is connected to the external connection conductor 241 through an interlayer connection conductor 275. The other end of the conductor pattern 221 is overlapped with the external connection conductor 242 when the resin substrate 10 is viewed from a plan view. The other end of the conductor pattern 221 is connected to the external connection conductor 242 through an interlayer connection conductor 276.

The conductor pattern 211 is preferably shorter than the conductor pattern 221 in the signal transmission direction. The conductor pattern 211 is spaced apart from the conductor pattern 221 in a width direction of the insulator layer 205. The conductor pattern 211 and the conductor pattern 221 are disposed to extend in parallel or substantially in parallel with each other along the signal transmission direction. A portion in which the conductor pattern 211 and the conductor pattern 221 extend in parallel or substantially in parallel with each other corresponds to a "parallel portion" of the first signal conductor and the second signal conductor.

Interlayer connection auxiliary conductors 2162, 2172, 2561, and 2562 are provided on an opposite side surface of the insulator layer 204 from the insulator layer 205. Each of the interlayer connection auxiliary conductors 2162, 2172, 2561, and 2562 preferably has a rectangular or substantially rectangular shape, for example.

The interlayer connection auxiliary conductors 2162 and 2561 are provided near one end of the insulator layer 204 in the signal transmission direction. From the one end side, the interlayer connection auxiliary conductor 2162 and the interlayer connection auxiliary conductor 2561 are arranged in this order. The interlayer connection auxiliary conductor 2162 is overlapped with the external connection conductor 231 when the resin substrate 10 is viewed from a plan view. The interlayer connection auxiliary conductor 2161 is overlapped with the ground conductor 251 between the external connection conductors 231 and 241 when the resin substrate 10 is viewed from a plan view.

The interlayer connection auxiliary conductors 2172 and 2562 are provided near the other end of the insulator layer 204 in the signal transmission direction. From the other end side, the interlayer connection auxiliary conductor 2172 and the interlayer connection auxiliary conductor 2562 are arranged in this order. The interlayer connection auxiliary conductor 2172 is overlapped with the external connection conductor 232 when the resin substrate 10 is viewed from a plan view. The interlayer connection auxiliary conductor 2162 is overlapped with the ground conductor 251 between the external connection conductors 232 and 242 when the resin substrate 10 is viewed from a plan view.

Intermediate ground conductors 253 and 254 are provided on an insulator layer 202 side surface of the insulator layer 203. The intermediate ground conductor 253 is provided near one end of the insulator layer 203 in the signal transmission direction. Preferably, the intermediate ground conductor 253 has a shape extending over a predetermined distance from the one end of the insulator layer 203 along the signal transmission direction and spreading over the entire or substantially the entire width of the insulator layer 203. In this case, the intermediate ground conductor 253 is disposed so as to overlap with one end of the conductor pattern 221 and so as not to overlap with the conductor pattern 211 when the resin substrate 10 is viewed from a plan view. The intermediate ground conductor 253 is connected to the ground conductor 251 via the interlayer connection auxiliary conductor 2561 and the interlayer connection conductor 281.

The intermediate ground conductor 254 is provided near the other end of the insulator layer 203 in the signal transmission direction. The intermediate ground conductor 254 preferably has a shape extending over a predetermined distance from the other end of the insulator layer 203 along the signal transmission direction and spreading over the entire or substantially the entire width of the insulator layer 203. In this case, the intermediate ground conductor 254 is disposed so as to overlap with the vicinity of the other end of the conductor pattern 221 and so as not to overlap with the conductor pattern 211 when the resin substrate 10 is viewed from a plan view. The intermediate ground conductor 254 is connected to the ground conductor 251 via the interlayer connection auxiliary conductor 2562 and the interlayer connection conductor 282.

Interlayer connection auxiliary conductors 212, 213, 2161, and 2171 are provided on an insulator layer 202 side surface of the insulator layer 203. Each of the interlayer connection auxiliary conductors 212, 213, 2161, and 2171 preferably has a rectangular or substantially rectangular shape. The interlayer connection auxiliary conductor 212 is disposed at a position that is overlapped with one end of the conductor pattern 211 on the insulator layer 204 when the resin substrate 10 is viewed from a plan view. The interlayer connection auxiliary conductor 213 is disposed at a position that is overlapped with the other end of the conductor pattern 211 on the insulator layer 204 when the resin substrate 10 is viewed from a plan view.

The interlayer connection auxiliary conductor 2161 is disposed within an area in which the intermediate ground conductor 253 is provided, and separated from the intermediate ground conductor 253 by the conductor non-forming portion. The interlayer connection auxiliary conductor 2161 is disposed at a position that is overlapped with the interlayer connection auxiliary conductor 2162 on the insulator layer 204 when the resin substrate 10 is viewed from a plan view.

The interlayer connection auxiliary conductor 2171 is disposed within an area in which the intermediate ground conductor 254 is provided, and separated from the intermediate ground conductor 254 by the conductor non-forming portion. The interlayer connection auxiliary conductor 2171 is disposed at a position that is overlapped with the interlayer connection auxiliary conductor 2172 on the insulator layer 204 when the resin substrate 10 is viewed from a plan view.

Conductor patterns 214 and 215 are provided on an insulator layer 201 side surface of the insulator layer 202. The conductor pattern 214 is disposed near one end of the insulator layer 202 in the signal transmission direction. The conductor pattern 215 is disposed near the other end of the insulator layer 202 in the signal transmission direction. Each of the conductor patterns 214 and 215 is a linear conductor that is primarily elongated in the signal transmission direction. Both ends of conductor patterns 214 and 215 in the elongated direction are bent, and the elongated portions of the conductor patterns 214 and 215 in the signal transmission direction are disposed at a position located farther apart from conductor pattern 221 than the both ends are.

One end of the conductor pattern 214 is overlapped with the interlayer connection auxiliary conductor 212 on the insulator layer 203 when the resin substrate 10 is viewed from a plan view. The one end of the conductor pattern 214 is connected to the one end of the conductor pattern 211 on the insulator layer 204 via the interlayer connection auxiliary conductor 212 and the interlayer connection conductor 271.

The other end of the conductor pattern 214 is overlapped with the interlayer connection auxiliary conductor 2161 on the insulator layer 203 when the resin substrate 10 is viewed from a plan view. The other end of the conductor pattern 214 is connected to the external connection conductor 231 via the interlayer connection auxiliary conductors 2161 and 2162, and the interlayer connection conductor 273.

Most of the portion in which the conductor pattern 214 is primarily elongated in the signal transmission direction is overlapped with the intermediate ground conductor 253 on the insulator layer 203 when the resin substrate 10 is viewed from a plan view.

One end of conductor pattern 215 is overlapped with the interlayer connection auxiliary conductor 213 on the insulator layer 203 when the resin substrate 10 is viewed from a plan view. The one end of the conductor pattern 215 is connected to the other end of the conductor pattern 211 on the insulator layer 204 via the interlayer connection auxiliary conductor 213 and the interlayer connection conductor 272.

The other end of the conductor pattern 215 is overlapped with the interlayer connection auxiliary conductor 2171 on the insulator layer 203 when the resin substrate 10 is viewed from a plan view. The other end of the conductor pattern 215 is connected to the external connection conductor 232 via the interlayer connection auxiliary conductors 2171 and 2172, and the interlayer connection conductor 274.

Most of the portion in which the conductor pattern 215 is primarily elongated in the signal transmission direction is overlapped with the intermediate ground conductor 254 of the insulator layer 203 when the resin substrate 10 is viewed from a plan view.

The portion including the conductor pattern 214 or the portion including the conductor pattern 215 corresponds to a "first connection portion".

Interlayer connection auxiliary conductors 2551 and 2552 are provided on an insulator layer 201 side surface of the insulator layer 202. Each of the interlayer connection auxiliary conductors 2551 and 2552 is preferably a rectangular or substantially rectangular conductor. The interlayer connection auxiliary conductor 2551 is disposed near one end of the insulator layer 202 in the signal transmission direction. The interlayer connection auxiliary conductor 2551 is overlapped with an intermediate ground conductor 253 when the resin substrate 10 is viewed from a plan view. The interlayer connection auxiliary conductor 2552 is disposed near the other end of the insulator layer 202 in the signal transmission direction. The interlayer connection auxiliary conductor 2552 is overlapped with an intermediate ground conductor 254 when the resin substrate 10 is viewed from a plan view.

The ground conductor 252 is provided on the entirety or substantially the entirety of an opposite side surface of the insulator layer 201 from the insulator layer 202. The ground conductor 252 is connected to the intermediate ground conductor 253 via the interlayer connection auxiliary conductor 2551 and the interlayer connection conductor 291. The ground conductor 252 is connected to intermediate ground conductor 254 via interlayer connection auxiliary conductor 2552 and interlayer connection conductor 292.

With such a structure, the first signal conductor 21 which includes the conductor patterns 211, 214, and 215, and the second signal conductor 22 which includes the conductor pattern 221 are provided using the resin substrate 10. Further, with such a structure, the external connection conductors 231, 232, 241, and 242, defining both ends of the first signal conductor 21 and the second signal conductor 22, are able to be arranged side by side along the signal transmission direction (see FIGS. 1A-1C, and FIG. 2), while the parallel portion (see FIG. 2, FIG. 3A, FIGS. 4A and 4B) in which two signal conductors are spaced apart from each other in the width direction of the resin substrate 10 and extend in parallel or substantially in parallel with each other is included. Thus, the external connection portion of the resin substrate 10 is able to be prevented from increasing in width.

Further, by using such a structure, as shown in FIG. 2, FIG. 3B, FIGS. 4A and 4B, the conductor patterns 214 and 215, defining the connection portions of the first signal conductor 21, are separated from the conductor pattern 221 near ends of the conductor pattern 221 of the second signal conductor 22, i.e., near a portion in which the conductor pattern 221 is connected to the external connection conductors 241 and 242. This makes it possible to ensure higher isolation between the first signal conductor 21 and the second signal conductor 22 in this portion.

Furthermore, by using such a structure, as shown in FIG. 2, FIG. 3B, FIGS. 4A and 4B, the intermediate ground conductor 253 and 254 are disposed between the conductor patterns 214 and 215, defining the connection portion of the first signal conductor 21, and the conductor pattern 221 near both ends of the conductor pattern 221 of the second signal conductor 22, i.e., near a portion in which the conductor pattern 221 is connected to the external connection conductors 241 and 242. This makes it possible to ensure higher isolation between the first signal conductor 21 and the second signal conductor 22 in this portion.

Furthermore, in the resin substrate 10 of the present exemplary preferred embodiment, a width of the conductor and a thickness of the insulator layer are determined as follows.

The conductor patterns 214 and 215, defining the connection portion of the first signal conductor 21, have a width W12 narrower than a width W11 of the conductor pattern 211 defining the parallel portion of the signal conductor 21. With such a structure, the characteristic impedance of the conductor patterns 214 and 215 whose distance from the ground conductor is shorter than that of the conductor pattern 211 is able to be set at an appropriate impedance.

Thicknesses D1, D2, and D3 of the insulator layers 201, 202, and 203 are less than thicknesses D4 and D5 of the insulator layers 204 and 205. A total thickness D123 of the thicknesses D1, D2, and D3 of the insulator layers 201, 202, and 203 is the same or substantially the same as a total thickness D45 of the thicknesses D4 and D5 of the insulator layers 204 and 205. Thus, the conductor pattern 211 of the first signal conductor 21 and the conductor pattern 221 of the second signal conductor 22 are easily disposed at the center or approximate center position of the resin substrate 10 in the thickness direction, while the characteristic impedance of the connection portion of the first signal conductor 21 is set to an appropriate impedance. This makes it possible to obtain the resin substrate 10 with a small transmission loss while setting the characteristic impedance appropriately.

Especially, for example, if the conditions of D1=D2=D3, D4=D5, and D1=(⅔)D4 are satisfied, the conductor patterns 214 and 215, which define the connection portion, are able to be disposed at a center or approximate center position between the ground conductor 252 and the intermediate ground conductors 253 and 254 in the thickness direction of the resin substrate 10, and the conductor patterns 211 and 221, which define the parallel portion, are able to be disposed at the center or approximate position between the ground conductor 251 and the ground conductor 252 in the thickness direction of the resin substrate 10. This makes it possible to obtain the resin substrate 10 with a small transmission loss while setting the characteristic impedance appropriately over the entire length.

Further, in the above-described structure, it is preferable that the conductor pattern 211 defining the parallel portion of the signal conductor 21 has a length longer than lengths of the conductor patterns 214 and 215 defining the connection portion of the first signal conductor 21, as shown in FIG. 2. Thus, the first signal conductor 21 has a wide width area elongated along the signal transmission direction. Therefore, a transmission loss of the first signal conductor 21 is prevented.

Note that, it is preferable that both ends of the conductor pattern 221 defining the second signal conductor 22, i.e., portions that are overlapped with the intermediate ground conductors 253 and 254 have a width W22 narrower than a width W21 of portions other than the above-described portions, as shown in FIG. 2. Thus, the characteristic impedance is prevented from changing in the portion where the conductor pattern 221 is overlapped with the intermediate ground conductor 253 and 254.

Figure 5:
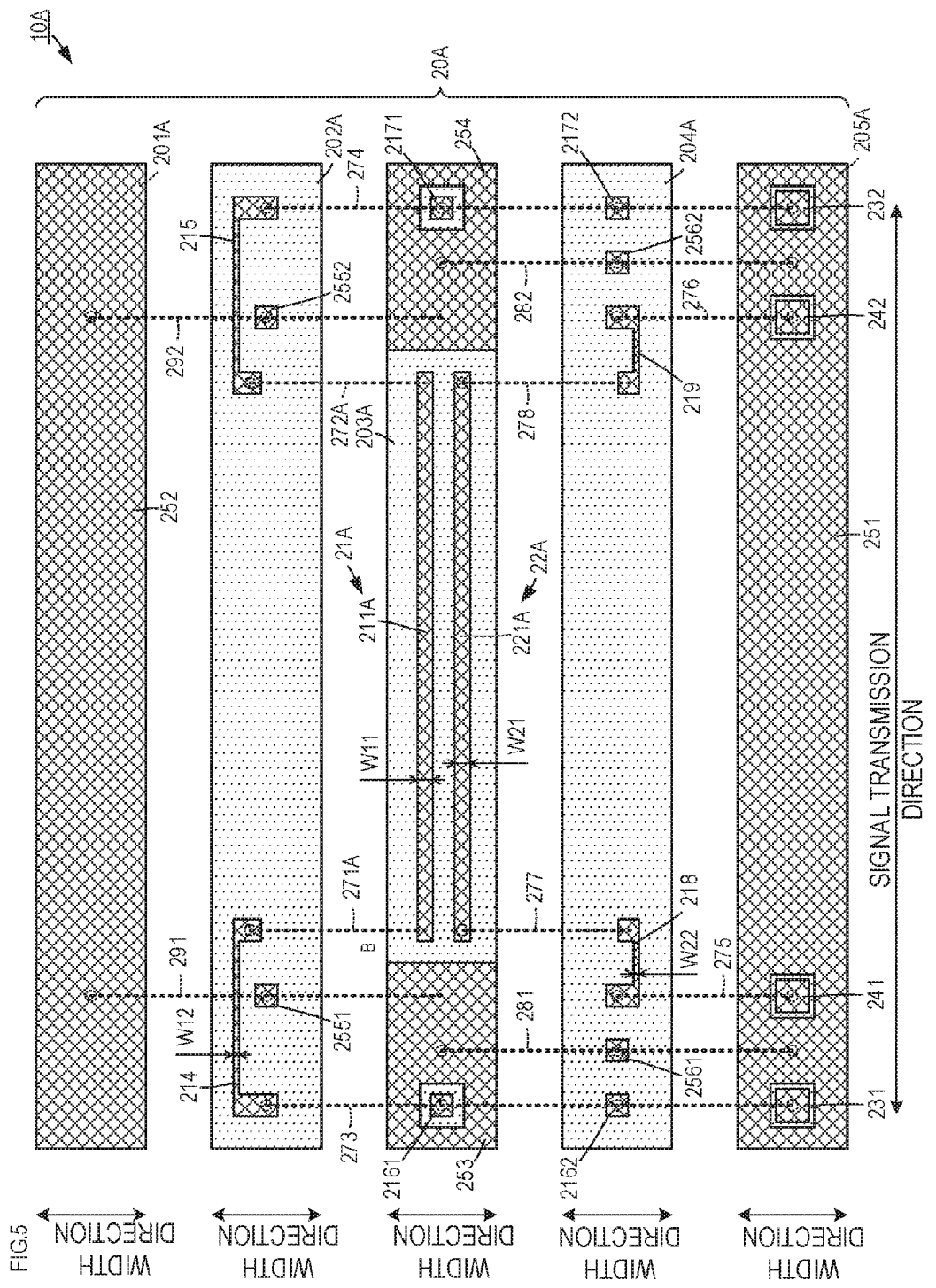
FIG. 5 is an exploded plan view of a resin substrate in accordance with a second exemplary preferred embodiment of the present invention.
Figure 6A:
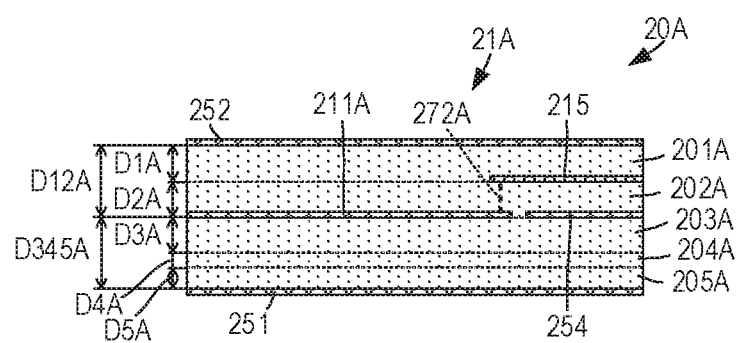
FIG. 6A is a cross-sectional view explaining a structure of a connection portion of the resin substrate in accordance with the second exemplary preferred embodiment of the present invention.
Figure 6B:
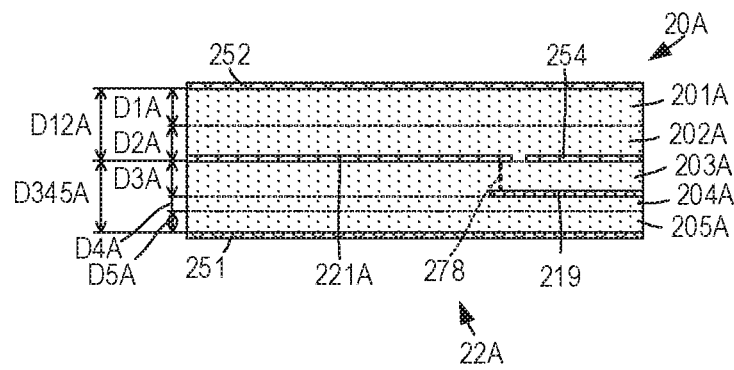
FIG. 6B is a cross-sectional view explaining a structure of a connection portion of the resin substrate in accordance with the second exemplary preferred embodiment of the present invention.

Next, a resin substrate in accordance with a second exemplary preferred embodiment of the present invention will be described with reference to the drawings. FIG. 5 is an exploded plan view of the resin substrate in accordance with the second exemplary preferred embodiment of the present invention. FIG. 6A shows a structure of the first signal conductor, and FIG. 6B shows a structure of the second signal conductor.

The resin substrate 10A in accordance with the present exemplary preferred embodiment is different from the resin substrate 10 in accordance with the first exemplary preferred embodiment in that both of a first signal conductor 21A and a second signal conductor 22A include a parallel portion and a connection portion. Other fundamental structures are the same or substantially the same, and therefore, only different portions will be described specifically below.

An insulating substrate 20A includes insulator layers 201A, 202A, 203A, 204A, and 205A that are laminated. Conductor patterns 211A and 221A are provided on an insulator layer 203A. Each of the conductor patterns 211A and 221A is a linear conductor pattern elongated in the signal transmission direction. The conductor patterns 211A and 221A are spaced apart from each other in a width direction of the insulator layer 203A and extend in parallel or substantially in parallel with each other. The conductor patterns 211A and 221A are disposed between the intermediate ground conductor 253 and the intermediate ground conductor 254 in the signal transmission direction of the insulator layer 203A.

Similar to the insulator layer 202 in accordance with the first exemplary preferred embodiment, conductor patterns 214 and 215 are provided on the insulator layer 202A. The conductor pattern 214 is connected to one end of the conductor pattern 211A via an interlayer connection conductor 271A. The conductor pattern 215 is connected to the other end of the conductor pattern 211A via an interlayer connection conductor 272A.

The first signal conductor 21A is defined by the conductor pattern 211A on the insulator layers 203A, the conductor patterns 214 and 215 on the insulator layer 204A, and the interlayer connection conductors 271A and 272A that connect these conductor patterns.

Conductor patterns 218 and 219 are provided on the insulator layer 204A. The conductor pattern 218 is provided on a side closer to one end of the insulator layer 204A than the center of the insulator layer 204A in the signal transmission direction. The conductor pattern 219 is provided on a side closer to the other end of the insulator layer 204A than the center of the insulator layer 204A in the signal transmission direction. Each of the conductor patterns 218 and 219 is a linear conductor that is primarily elongated in the signal transmission direction. Both ends of the conductor patterns 218 and 219 in the elongated direction are bent, and the elongated portions of the conductor patterns 218 and 219 in the signal transmission direction are disposed at a position located farther apart from conductor pattern 211A than the both ends are.

One end of the conductor pattern 218 is overlapped with the one end of the conductor pattern 221A of the insulator layer 203A when the resin substrate 10A is viewed from a plan view. The one end of the conductor pattern 218 is connected to the one end of the conductor pattern 221A on the insulator layer 203A via an interlayer connection conductor 277.

The other end of the conductor pattern 218 is overlapped with the external connection conductor 241 on the insulator layer 205A when the resin substrate 10A is viewed from a plan view. The other end of the conductor pattern 218 is connected to the external connection conductor 241 via the interlayer connection conductor 275.

Most of the portion in which the conductor pattern 218 is primarily elongated in the signal transmission direction is overlapped with the intermediate ground conductor 253 on the insulator layer 203A when the resin substrate 10A is viewed from a plan view.

One end of the conductor pattern 219 is overlapped with the other end of the conductor pattern 221A on the insulator layer 203A when the resin substrate 10A is viewed from a plan view. The one end of conductor pattern 219 is connected to the other end of the conductor pattern 221A on the insulator layer 203A via the interlayer connection conductor 278.

The other end of the conductor pattern 219 is overlapped with the external connection conductor 242 of the insulator layer 205A when the resin substrate 10A is viewed from a plan view. The other end of the conductor pattern 219 is connected to the external connection conductor 242 via the interlayer connection conductor 276.

Most of the portion in which the conductor pattern 219 is primarily elongated in the signal transmission direction is overlapped with the intermediate ground conductor 254 on the insulator layer 203A when the resin substrate 10A is viewed from a plan view.

The portion including the conductor patterns 218 or the portion including the conductor pattern 219 corresponds to a "second connection portion".

With such a structure, both of the first signal conductor 21A and the second signal conductor 22A, which extend in parallel or substantially in parallel with each other, extend adjacent to or near the external connection conductors 231, 232, 241, and 242, so as to make it possible to ensure higher isolation in the portion. Further, by providing both of the connection portions, the degree of freedom of wiring is improved near the external connection conductors 231, 232, 241, and 242.

Note that, in the structure of the present exemplary preferred embodiment, thicknesses of insulator layers 201A, 202A, 203A, 204A, and 205A may be determined as follows.

Thicknesses D1A, D2A, and D3A of the insulator layers 201A, 202A, and 203A are greater than thicknesses D4A and D5A of the insulator layers 204A and 205A. The thickness D4A of the insulator layer 204A is greater than the thickness D5A of the insulator layer 205A. A total thickness D12A of thicknesses D1A and D2A of the insulator layers 201A and 202A is the same or substantially the same as a total thickness D345A of thicknesses D3A, D4A, and D5A of the insulator layers 203A, 204A, and 205A. Thus, the conductor pattern 211A of the first signal conductor 21A and the conductor pattern 221A of the second signal conductor 22A are easily disposed at a center or approximate center position of the resin substrate 10A in the thickness direction, while the characteristic impedance of the connection portions of the first signal conductor 21A and the second signal conductor 22A is set appropriately. Further, even in the connection portion of the first signal conductor 21A, the conductor patterns 214 and 215 are easily disposed at a center position between the intermediate ground conductors 253 and 254 and the ground conductor 252 in the thickness direction of the resin substrate 10A. Even in the connection portion of the second signal conductor 22A, the conductor patterns 218 and 219 are easily disposed at a center position between the intermediate ground conductors 253 and 254 and the ground conductor 251 in the thickness direction of the resin substrate 10A. This makes it possible to obtain the resin substrate 10A with a small transmission loss while setting characteristic impedance appropriately.

Especially, for example, if the conditions of $D1A=D2A=D3A$, $D4A=(2/3)D1A$, and $D5A=(1/3)D1A$ are satisfied, the conductor patterns 214 and 215, which define the connection portion of the first signal conductor 21A, are able be disposed at the center or approximate center position between the ground conductor 252 and the intermediate ground conductors 253 and 254 in the thickness direction of the resin substrate 10A. Further, the conductor patterns 218 and 219, which define the connection portion of the second signal conductor 22A, are able to be disposed at a center or approximate center position between the ground conductor 251 and the intermediate ground conductors 253 and 254. Furthermore, the conductor patterns 211A and 221A, which define the parallel portion, are able to be disposed at a center or approximate center position between the ground conductor 251 and the ground conductor 252. This makes it possible to obtain the resin substrate 10A with a small transmission loss while setting the characteristic impedance appropriately.

Figure 7A:
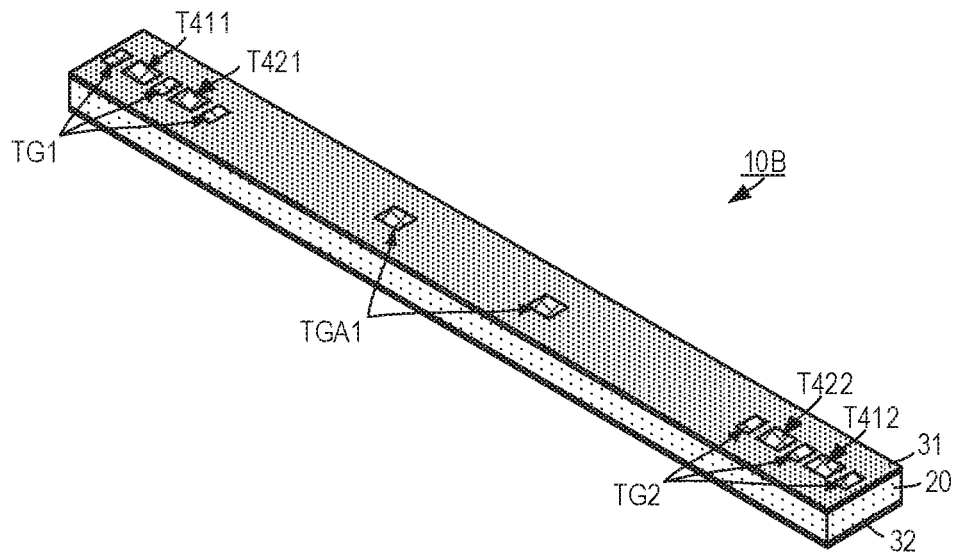
FIG. 7A is an external perspective view of a resin substrate and an insulating substrate in accordance with a third exemplary preferred embodiment of the present invention.
Figure 7B:
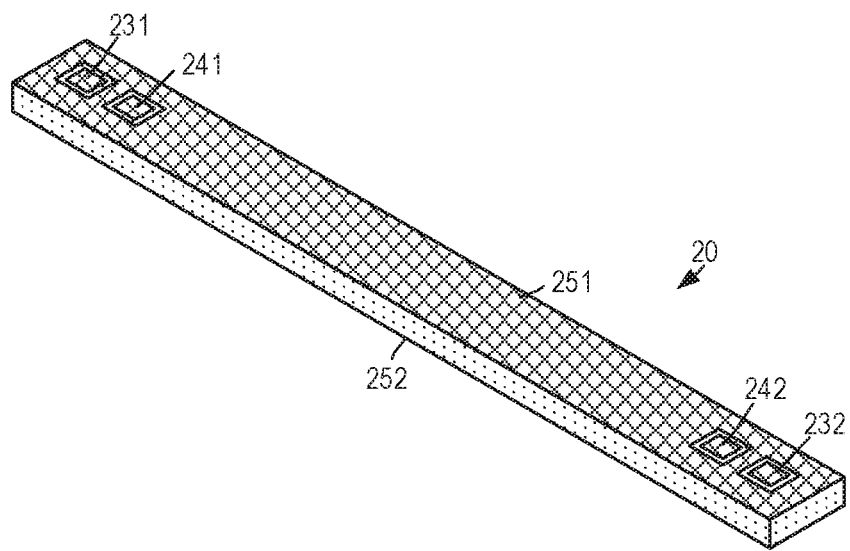
FIG. 7B is an external perspective view of an insulating substrate in accordance with the third exemplary preferred embodiment of the present invention.

Next, a resin substrate in accordance with a third exemplary preferred embodiment of the present invention will be described with reference to the drawings. FIG. 7A is an external perspective view of the resin substrate in accordance with the third exemplary preferred embodiment of the present invention. FIG. 7B is an external perspective view of an insulating substrate in accordance with the third exemplary preferred embodiment of the present invention.

A resin substrate 10B in accordance with the present exemplary preferred embodiment is different from the resin substrate 10 in accordance with the first exemplary preferred embodiment in that the connector member 411, 412, 421, and 422 are omitted and the structure of the external connection portion is changed. Other structures are the same or substantially the same as the resin substrate 10 in accordance with the first exemplary preferred embodiment, and therefore, only different portions will be described specifically in the following.

As shown in FIG. 7B, the insulating substrate 20 includes the structure of the first exemplary preferred embodiment. As shown in FIG. 7A, a plurality of openings are provided in the insulating protection member 31, and the external connection conductors 231, 232, 241, and 242, and a portion of the ground conductor 251 are exposed at the outside.

The opening from which the external connection conductor 231 is exposed defines and functions as an external connection terminal T411 of the first signal conductor 21, and the opening from which the external connection conductor 232 is exposed defines and functions as an external connection terminal T412 of the first signal conductor 21. The opening from which the external connection conductor 241 is exposed defines and functions as an external connection terminal T421 of the second signal conductor 22, and the opening from which the external connection conductor 242 is exposed defines and functions as an external connection terminal T422 of the second signal conductor 22.

A plurality of openings from which the ground conductor 251 is exposed are located close to the external connection terminals T411 and T421, and define and function as a grand connection terminal TG1. A plurality of openings from which the ground conductor 251 is exposed are located close to the external connection terminals T412 and T422, and define and function as a grand connection terminal TG2. Further, a plurality of openings from which the ground conductor 251 is exposed are located in a middle position of the resin substrate 10B in the signal transmission direction, and define and function as an auxiliary ground connection terminal TGA1.

By using the resin substrate 10B with such a structure, the resin substrate 10B is able to be mounted on an external circuit board or other suitable structure through a surface mount technology. Further, a mounting portion of the resin substrate 10B is able to be lowered in height by a height of the connector member.

Note that, the shape of the resin substrate in each of the exemplary preferred embodiments mentioned above may be modified as follows. FIG. 8 is a side view showing a modification of the resin substrate. In FIG. 8, the resin substrate 10 in accordance with the first exemplary preferred embodiment is described as an example, but the modification may also be applicable to the resin substrates in accordance with other exemplary preferred embodiments.

The resin substrate 10 preferably includes a curved portion CS in a middle portion of the resin substrate 10 in the signal transmission direction. By providing the curved portion CS in the resin substrate 10, one end side position of the resin substrate 10, which includes the connector members 411 and 421, is different from the other end side portion of the resin substrate 10, which includes the connector members 412 and 422, in a direction (direction parallel to the thickness direction) perpendicular or substantially perpendicular to the signal transmission direction and the width direction when the resin substrate 10 is viewed from a side view. The curved portion CS is able to be easily provided such that the resin substrate 10 defined by an insulating substrate made of a thermoplastic resin is sandwiched by press jigs 901 and 902 including a curved surface, and then heated and cooled. Accordingly, as an insulating substrate of the resin substrate, the insulating substrate preferably contains thermoplastic resins, such as a liquid crystal polymer, for example.

Figure 9:
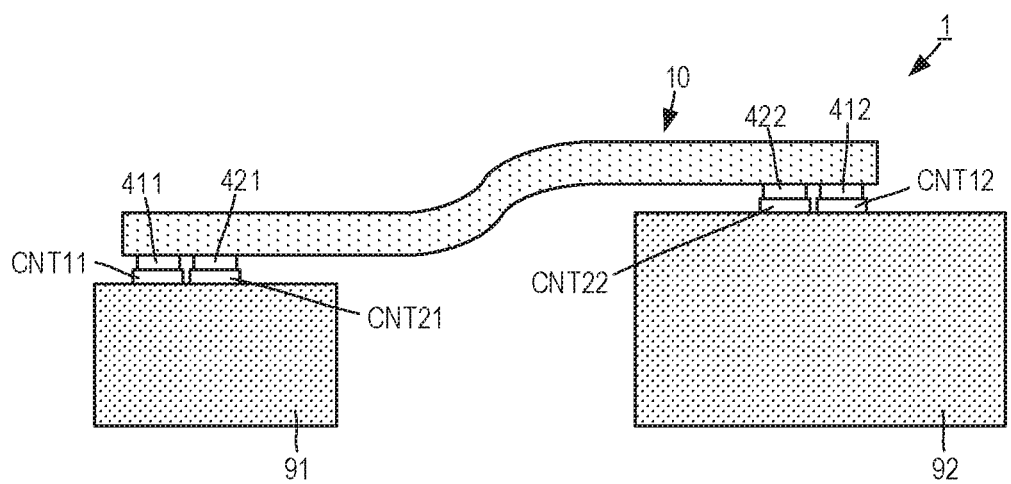
FIG. 9 is a side view showing a way of mounting the resin substrate on a plurality of circuit boards.

With such a configuration, the mounting structure as shown in FIG. 9 is able to be achieved. FIG. 9 is a side view showing the resin substrate being mounted on a plurality of circuit boards.

As shown in FIG. 9, the connector members 411 and 421 on the resin substrate 10 are connected to circuit board side connectors CNT11 and CNT21 on a circuit board 91, respectively. A group of the circuit board side connectors CNT11 and CNT21 corresponds to a group of a "first circuit board side connector" and a "second circuit board side connector". The connector members 412 and 422 on the resin substrate 10 are connected to circuit board side connectors CNT12 and CNT22 on a circuit board 92, respectively. A group of the circuit board side connectors CNT12 and CNT22 corresponds to a group of the "first circuit board side connector" and the "second circuit board side connector".

As shown in FIG. 9, the circuit board 91 includes a mounting surface whose height is different from a height of a mounting surface of the circuit board 92. However, the circuit board 91 and the circuit board 92 are able to be easily connected by curving the flexible resin substrate 10. Note that, since the resin substrate 10 has flexibility, the above-described connection is made possible without forming the curved portion CS in advance by using the method shown in FIG. 8. However, if the curved portion CS is formed in advance by using the method shown in FIG. 8, a stress applied to a terminal area will be relaxed after the connection, so as to further improve the connection reliability.

Figure 10A:
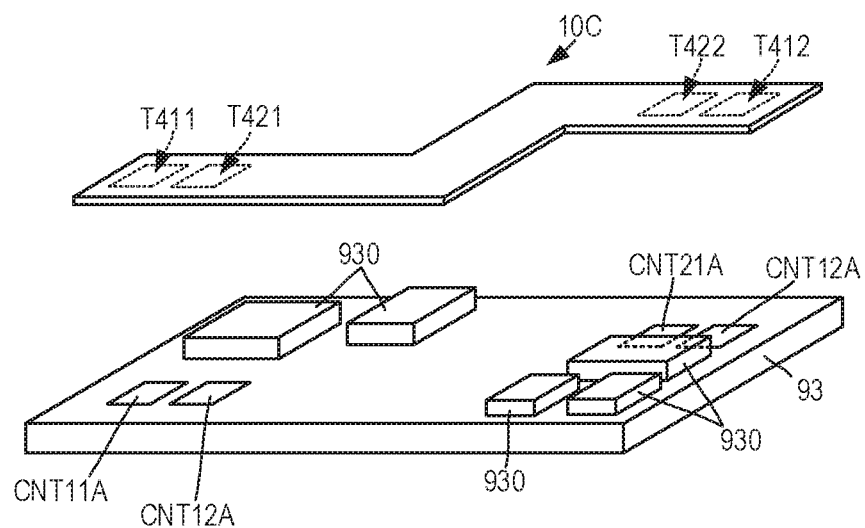
FIG. 10A is an exploded perspective view and an external perspective view showing a way of mounting the resin substrate on a circuit board.
Figure 10B:
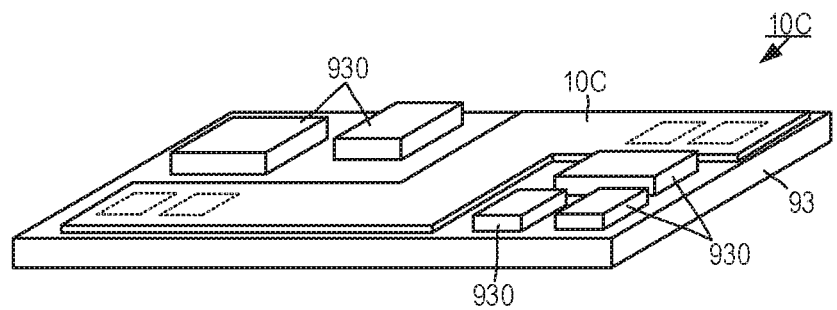
FIG. 10B is an external perspective view showing a way of mounting a resin substrate on a circuit board.

Further, a resin substrate that does not include the above-described connector members is able to be mounted on a circuit board as shown below. FIG. 10A is an exploded perspective view showing a manner of mounting the resin substrate on a circuit board, and FIG. 10B is an external perspective view showing a manner of mounting the resin substrate on a circuit board.

A structure of a fundamental conductor pattern of a resin substrate 10C is the same or substantially the same as the above-described structure of the resin substrate 10B shown in FIG. 7, and includes a bending portion in the middle of the resin substrate 10C in the signal transmission direction. The entire resin substrate 10C is configured to be positioned on one plane, and the signal transmission direction is bent (changed) in the plane.

External connection terminals T411 and T421 of the resin substrate 10C are bonded to land conductors CNT11A and CNT21A on a circuit board 93 through a conductive material (for example, solder). External connection terminals T412 and T422 of the resin substrate 10C are bonded to land conductors CNT12A and CNT22A on the circuit board 93 through a conductive material (for example, solder). A group of the land conductor CNT11A and the land conductor CNT21A corresponds to a group of a "first land conductor" and a "second land conductor," and a group of the land conductor CNT12A and the land conductor CNT22A corresponds to a group of the "first land conductor" and the "second land conductor." Thus, the resin substrate 10C is able to be mounted on the circuit board 93 by using the same surface mount process as other mounting components 930, so as to make it possible to simplify the manufacturing process.

Further, various kinds of mounting components 930 are preferably mounted on the circuit board 93, and the resin substrate 10C is mounted along an area of the circuit board 93 on which mounting components 930 are not mounted. In this manner, by using a resin substrate with the structure of preferred embodiments of the present invention, the resin substrate is able to be mounted according to the arrangement of other mounting components 930 mounted on the circuit board 93, so as to improve the degree of freedom of arrangement of the mounting components 930 on the circuit board 93. Further, by using a resin substrate with the structure of preferred embodiments of the present invention, even if connection portions of two signal conductors are provided close to each other on the circuit board 93, isolation between the signal conductors will be ensured. Thus, the resin substrate including two signal conductors is able to be easily mounted on the circuit board 93.

Note that, each exemplary preferred embodiment describes an example where two signal conductors partially extend in parallel or substantially in parallel with each other, but the structure of each exemplary preferred embodiment is also applicable to a structure in which three or more signal conductors partially extend in parallel or substantially in parallel with one another.

Further, each exemplary preferred embodiment describes the example where the resin substrate merely transmits a high frequency signal, but the conductor pattern of the insulating substrate may also be used to define a filter circuit.

Further, each exemplary preferred embodiment describes a structure in which an external connection portion defining one end of the first signal conductor is located closer to one end of the resin substrate than an external connection portion defining one end of the second signal conductor is, and an external connection portion defining the other end of the first signal conductor is located closer to the other end of the resin substrate than an external connection portion defining the other end of the second signal conductor is. However, the above-described structure is also applicable to a structure in which an external connection portion defining one end of the first signal conductor is located closer to one end of the resin substrate than an external connection portion defining one end of the second signal conductor is, and an external connection portion defining the other end of the second signal conductor is located closer to the other end of the resin substrate than an external connection portion defining the other end of the first signal conductor is. Thus, application to various kinds of mounting patterns is possible.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin substrate comprising:
   an insulating substrate;
   a first signal conductor and a second signal conductor that are provided on the insulating substrate, the first signal conductor and the second signal conductor partially extending in parallel or substantially in parallel with each other along a signal transmission direction;
   a first external connection terminal that is connected to one end of the first signal conductor in the signal transmission direction and exposed at a first surface of the insulating substrate; and
   a second external connection terminal that is connected to one end of the second signal conductor in the signal transmission direction and exposed at the first surface of the insulating substrate; wherein
   the first external connection conductor and the second external connection conductor are arranged side by side along the signal transmission direction;
   the first signal conductor includes a parallel portion that extends in parallel or substantially in parallel with the second signal conductor along the signal transmission direction, and a first connection portion that connects the parallel portion and the first external connection conductor;
   in a portion where the first signal conductor and the second signal conductor extend in parallel or substantially in parallel with each other, the first signal conductor and the second signal conductor are disposed at a common position in a thickness direction of the insulating substrate; and
   the first connection portion is disposed at a different position from the second signal conductor in the thickness direction and a width direction of the insulating substrate.

2. The resin substrate according to claim 1, wherein a width of the insulating substrate in a portion where the first external connection conductor and the second external connection conductor are provided is equal to or narrower than a width of the insulating substrate in the parallel portion.

3. The resin substrate according to claim 1, wherein a conductor width in the parallel portion is wider than a conductor width in the first connection portion.

4. The resin substrate according to claim 1, wherein a length of the parallel portion is longer than a length of the first connection portion.

5. The resin substrate according to claim 1, wherein, in the thickness direction of the insulating substrate, an intermediate ground conductor is disposed between a position in which the first connection portion is disposed and a position in which the second signal conductor is disposed.

6. The resin substrate according to claim 5, wherein
   a ground conductor is disposed between the first external connection conductor and the second external connection conductor on the first surface of the insulating substrate; and the ground conductor and the intermediate ground conductor are connected through an interlayer connection conductor.

7. The resin substrate according to claim 6, wherein the ground conductor is provided on an entirety or substantially an entirety of the first surface of the insulating substrate.

8. The resin substrate according to claim 7, further comprising:
   another ground conductor provided on a second surface of the insulating substrate opposite to the first surface of the insulating substrate;
   the another ground conductor and the intermediate ground conductor are connected through another interlayer connection conductor.

9. The resin substrate according to claim 8, wherein an insulating protection member is provided on the second surface of the insulating substrate.

10. The resin substrate according to claim 9, wherein an entirety or substantially an entirety of the another ground conductor is covered with the insulating protection member.

11. The resin substrate according to claim 5, wherein a conductor width in a portion where the second signal conductor faces the intermediate ground conductor is narrower than a conductor width in a portion where the second signal conductor extends in parallel or substantially in parallel with the first signal conductor.

12. The resin substrate according to claim 1, wherein
   the second signal conductor includes a parallel portion that extends in parallel or substantially in parallel with the first signal conductor along the signal transmission direction, and a second connection portion that connects the parallel portion and the second external connection conductor; and
   the second connection portion is disposed at a different position from the first connection portion in the thickness direction and the width direction of the insulating substrate.

13. The resin substrate according to claim 1, wherein the insulating substrate is made of a thermoplastic resin.

14. The resin substrate according to claim 1, wherein the insulating substrate is made a liquid crystal polymer-based resin.

15. The resin substrate according to claim 1, wherein the insulating substrate has flexibility.

16. The resin substrate according to claim 1, further comprising:
   a first connector member mounted on the first external connection conductor; and
   a second connector member mounted on the second external connection conductor.

17. The resin substrate according to claim 1, further comprising:
   a curved portion in a middle portion of the resin substrate in the signal transmission direction.

18. The resin substrate according to claim 17, wherein a position of one end of the resin substrate is different from a position of the other end of the resin substrate in the thickness direction of the insulating substrate.

19. An electronic device comprising:
   the resin substrate according to claim 16; and
   a circuit board on which a first circuit board side connector to be connected to the first connector member and a second circuit board side connector to be connected to the second connector member are provided.

20. An electronic device comprising:
   the resin substrate according to claim 1; and
   a circuit board on which a first land conductor and a second land conductor on which the first external connection conductor and the second external connection conductor are to be mounted, respectively are provided; wherein
   the first external connection conductor is bonded to the first land conductor through a conductive material, and the second external connection conductor is bonded to the second land conductor through a conductive material to surface-mount the resin substrate on the circuit board.

* * * * *